United States Patent
Opris (10) Patent No.: US 8,502,581 B1
(45) Date of Patent: Aug. 6, 2013

(54) MULTI-PHASE DIGITAL PHASE-LOCKED LOOP DEVICE FOR PIXEL CLOCK RECONSTRUCTION

(76) Inventor: Ion E. Opris, San Jose, CA (US)

( * ) Notice: Subject to any disclaimer, the term of this patent is extended or adjusted under 35 U.S.C. 154(b) by 853 days.

(21) Appl. No.: 12/658,366

(22) Filed: Feb. 6, 2010

(51) Int. Cl.
*H03L 7/06* (2006.01)

(52) U.S. Cl.
USPC .................... 327/159; 327/150; 713/400

(58) Field of Classification Search
USPC .............. 327/147, 150, 156, 159; 713/400
See application file for complete search history.

(56) References Cited

U.S. PATENT DOCUMENTS

| | | | | |
|---|---|---|---|---|
| 6,028,488 A | * | 2/2000 | Landman et al. | 331/1 A |
| 6,052,034 A | * | 4/2000 | Wang et al. | 331/2 |
| 6,965,660 B2 | * | 11/2005 | Strohmayer | 375/376 |
| 7,592,874 B2 | * | 9/2009 | Wicpalek et al. | 331/25 |
| 7,714,669 B2 | * | 5/2010 | Gotz et al. | 331/17 |
| 7,750,701 B2 | * | 7/2010 | Ainspan et al. | 327/159 |
| 7,809,345 B2 | * | 10/2010 | May | 455/260 |
| 7,986,190 B1 | * | 7/2011 | Lye | 331/1 A |
| 8,050,376 B2 | * | 11/2011 | Liu et al. | 375/376 |
| 8,165,260 B2 | * | 4/2012 | Nagaraj et al. | 375/376 |
| 8,362,815 B2 | * | 1/2013 | Pavlovic et al. | 327/156 |
| 8,395,453 B2 | * | 3/2013 | Chang et al. | 331/1 A |
| 2007/0008040 A1 | * | 1/2007 | Mayer et al. | 331/1 A |
| 2009/0190283 A1 | * | 7/2009 | Hammerschmidt et al. | 361/240 |
| 2010/0123488 A1 | * | 5/2010 | Palmer et al. | 327/115 |

\* cited by examiner

*Primary Examiner* — William Hernandez (57) ABSTRACT

A reconstruction circuit for the pixel clock in digital display units receiving analog display data uses a multi-phase reference clock and an all digital PLL for clock generation and synchronization to an external sync signal. A phase/frequency detector in the digital PLL uses a multi-phase reference clock to achieve a high resolution of the phase error. The digital PLL control algorithm can be implemented with a single loop and can achieved arbitrary large, externally controlled, phase difference between the generated pixel clock and the input sync signal.

11 Claims, 9 Drawing Sheets

MULTI-PHASE DIGITAL PHASE-LOCKED LOOP DEVICE FOR PIXEL CLOCK RECONSTRUCTION

TECHNICAL FIELD

The invention relates generally to systems that utilize phase synchronized clock signals and, more specifically, to a method and apparatus for recovery of the pixel clock associated with the analog display data received in digital display units.

BACKGROUND

Digital display units required to be compatible to analog displays need to convert the received analog data into a sequence of pixel data. In general, a pixel clock is not provided together with the analog data by the video interface, but such pixel clock needs to be recovered from other clock signals, such as the horizontal sync clock, which has much lower frequency.

Figure 1:
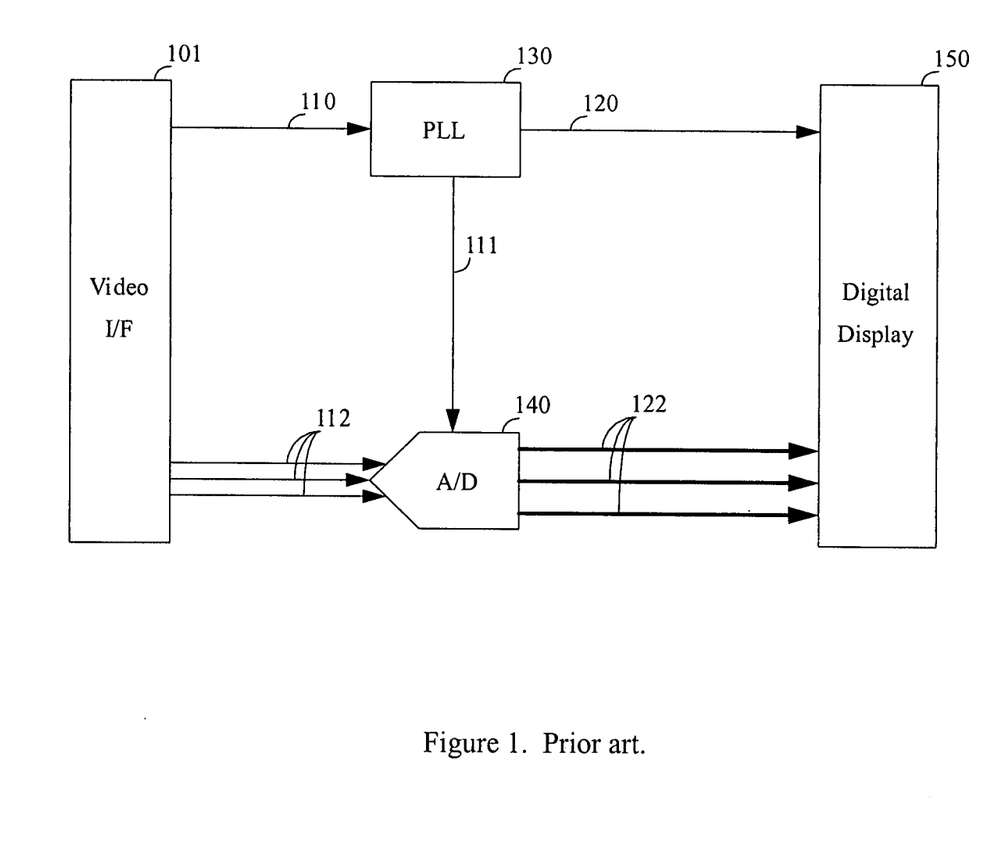
FIG. 1 is a block diagram of a conventional digital display interface.

A typical digital display interface configured to receive analog display data is shown in FIG. 1. The video interface 101 sends analog data signals 112 synchronized with a sync clock 110 with a frequency in general much lower than the pixel rate. The analog data 112 is digitized by an analog-to-digital converter (ADC) module 140 comprising one or more analog-to-digital converters (ADC). The ADC module has only a certain window during each pixel clock period in which to sample the correct analog data. Therefore, a phase-locked loop (PLL) device 130 is required to regenerate a pixel clock 120 for the digital display unit and synchronize this pixel clock to the input sync signal. In most applications, the phase of the ADC sample clock 111 also needs to be adjusted with a resolution much finer than one pixel clock to provide the best timing window for the sampling of the incoming analog signals.

In principle, a phase-locked loop (PLL) can be used to generate a pixel clock synchronized to the input sync clock. However, the multiplication factor is larger than the number of pixels per line, which can easily be larger than 1,000, for example, and such a large multiplication number determines a large long term jitter in an analog PLL approach.

A solution for the pixel clock regeneration, proposed in U.S. Pat. No. 6,320,574, uses a digital PLL driven by an external stable clock, such as a crystal oscillator, together with an analog filter to reduce the phase jumps out of the pure digital PLL. While this solution achieves good long term stability of the recovered pixel clock, the implementation appears to require a somewhat complicated digital synthesizer and several analog components, such as a digital-to-analog converter (DAC), a reconstruction filter, and an analog PLL as a clock output filter and frequency multiplier. The described early/late phase detector does not have the capability of resolving phase difference smaller than one reference clock cycle, which is fairly coarse, and will determine large jitter in the output clock, therefore requiring an analog output filter. Another limitation is the maximum rate if the synthesized clock is only a fraction of the reference clock. Therefore, for most common applications, this solution requires a frequency multiplication in the analog output filter.

An all digital PLL, previously proposed in U.S. Pat. No. 6,628,276, avoids the use of any analog components, therefore being more robust to various process technology changes. This implementation, however, appears to require a relatively high frequency input reference clock, with at least twice the frequency of the output pixel rate, and complicated digital subsystems such as a high precision digital phase comparator and a delay lock loop (DLL). The described high precision digital phase comparator has very good resolution, but has only a finite phase detection range, and, therefore, other state machines have to detect when the phase error is small enough for the output of the high precision phase detector is valid. Also, the actual delay elements in the high precision phase comparator have to match the delay in the pixel clock synthesizer, so the phase error tracks the pixel clock rate. The described implementation is rather complex, requiring several delay lines and a fast reference clock, which would be in fact generated by an analog clock multiplier or PLL.

Thus, in a real application, it would be advantageous to provide an implementation that can handle large possible phase errors, even after lock capturing, especially in a noisy environment, where the jitter in the input sync clock can be actually larger than a pixel clock period.

SUMMARY

In accordance with embodiments described in detail below, a reconstruction circuit for the pixel clock in digital display units receiving analog display data uses a multi-phase reference clock and an all digital PLL for clock generation and synchronization to an external sync signal. The multi-phase reference clock signal is generated by a multi-phase output PLL locked to a crystal oscillator or another stable timing reference. A phase/frequency detector in the digital PLL uses a multi-phase reference clock to achieve a high resolution of the phase error. The phase resolution is determined by the phase difference between two successive phases in the multi-phase reference clock and can be a small fraction of the reference clock period.

The digital PLL control algorithm may be implemented with a single loop and may achieve arbitrary large, externally controlled, phase difference between the generated pixel clock and the input sync signal.

In other embodiments described below, the digital PLL output is passed through a frequency multiplier or an analog PLL used as an output analog filter. The multiplication ratio is kept low and the loop bandwidth of the analog PLL can be high to maintain good long term stability.

These and other features of the present invention will be apparent from consideration of the following detailed description of the invention and the accompanying drawings.

DETAILED DESCRIPTION

In most digital or mixed-mode systems, a reference system clock is available. This clock, usually generated by a crystal oscillator, has a frequency in the MHz or tens of MHz range. Since most systems work with much higher digital clock frequencies, phase-locked loops (PLLs) are used to generate such higher frequency clocks locked to the system reference clock.

For the particular embodiment of a digital display receiving analog data, the ADC needs a pixel clock for sampling the analog data with an exemplary frequency typically above 100 MHz and low jitter. A digital PLL may be used to generate the pixel clock from a reference clock. However, to avoid the need for any analog filter at the output of the digital PLL, the reference clock frequency needs to generally be higher than the required jitter performance. For example, a jitter requirement of 0.5 ns pk-pk, which is typical for high resolution displays, would require phase jumps in the reference clock smaller than 0.5 ns, or an equivalent frequency of 2 GHz. Such high frequencies are not practical for digital PLLs because of propagation delays and high power dissipation.

Figure 2:
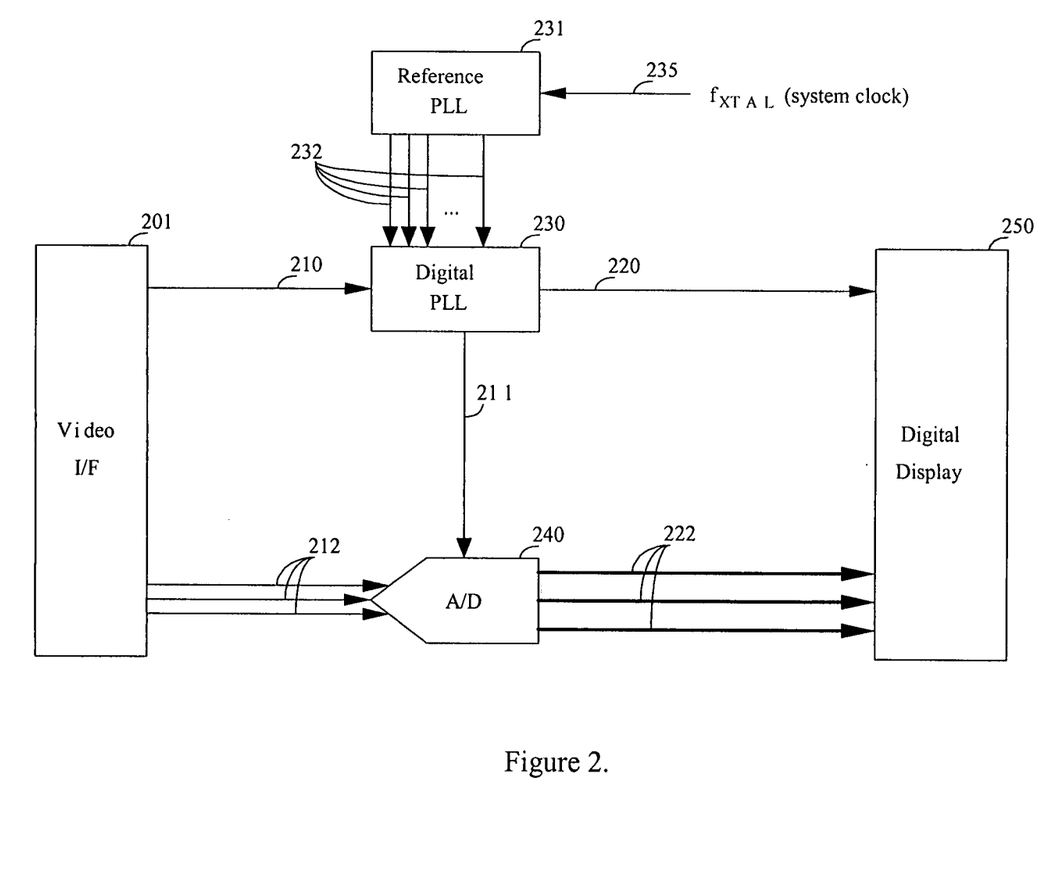
FIG. 2 is a block diagram of a digital display interface, according to one embodiment of the invention.

Referring to FIG. 2, one embodiment to regenerate the pixel clock from the input sync signal involves the use of a digital PLL using a multi-phase reference clock. In one embodiment, the reference clock frequency may be in the hundred of MHz range, while multiple phases are used such that the phase jump between two adjacent phases can be much smaller than 1 ns.

As an example, it is considered here an input crystal frequency $f_{XTAL}$ of 14.318 MHz, which is a common known value for system clock frequency in video applications, a PLL multiplication factor $N_{PLL}$ of 32, and a number of $N_{ph}$ of 10 phases. The time delay per phase will be $$T_{ph} = \frac{1}{f_{XTAL} \cdot N_{PLL} \cdot N_{ph}} \quad (1)$$

while the multi-phase reference clock frequency in this case will be $$f_{CLK} = f_{XTAL} \cdot N_{PLL} \quad (2)$$

or about 458 MHz, the time delay per each phase will be about 218 ps, equivalent to a 4.58 GHz clock.

With the digital PLL described, in one embodiment, the regenerated pixel clock can have a maximum frequency up to one half of the reference clock frequency given by equation (2), or 229 MHz in this example, and a peak-to-peak jitter below twice the time delay per phase as indicated by equation (1), or below about 400 ps pk-pk. This performance will cover a large number of current digital display applications.

Figure 3:
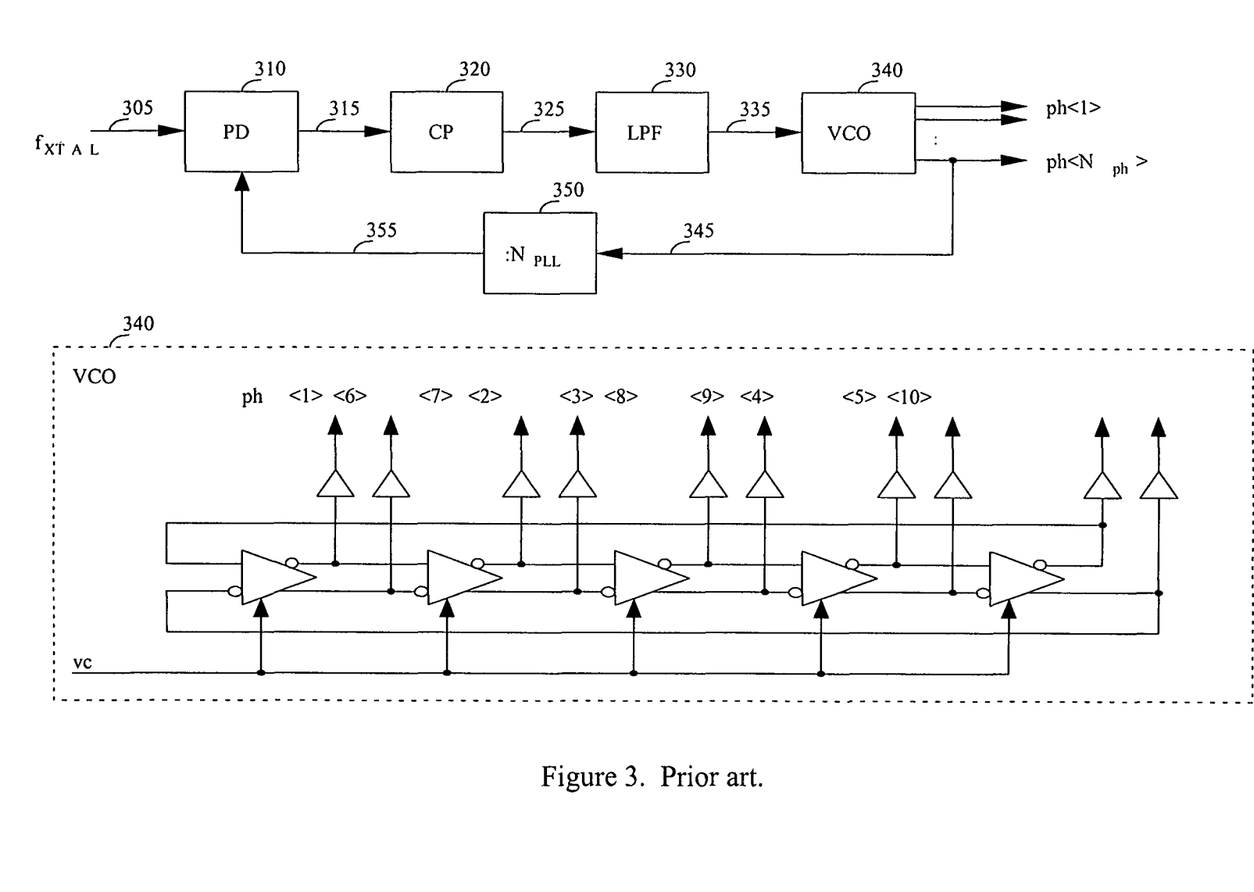
FIG. 3 is a block diagram of a conventional multi-phase reference clock output PLL.

The reference clock PLL to generate the multi-phase reference clock, in this example the 458 MHz clock with 10 phase, is well known in the art. A block diagram for such a conventional PLL, illustrated in FIG. 3, is based on a multiple phase output ring oscillator 340. Other configurations are possible. For example, the article "Precise Delay Generation Using Coupled Oscillators," by John G. Maneatis and Mark A. Horowitz, in IEEE Journal of Solid-State Circuits, vol. 28, pp. 1273-1282, December 1993, describes a technique to generate multi-phase clocks with phase differences smaller than a gate delay.

Due to the low multiplication value $N_{PLL}$, the output jitter of this reference clock PLL can be maintained at relatively low level, under tens of ps pk-pk. The long term stability is also good, since this reference clock is locked to a stable system clock driven by a crystal oscillator.

Figure 4:
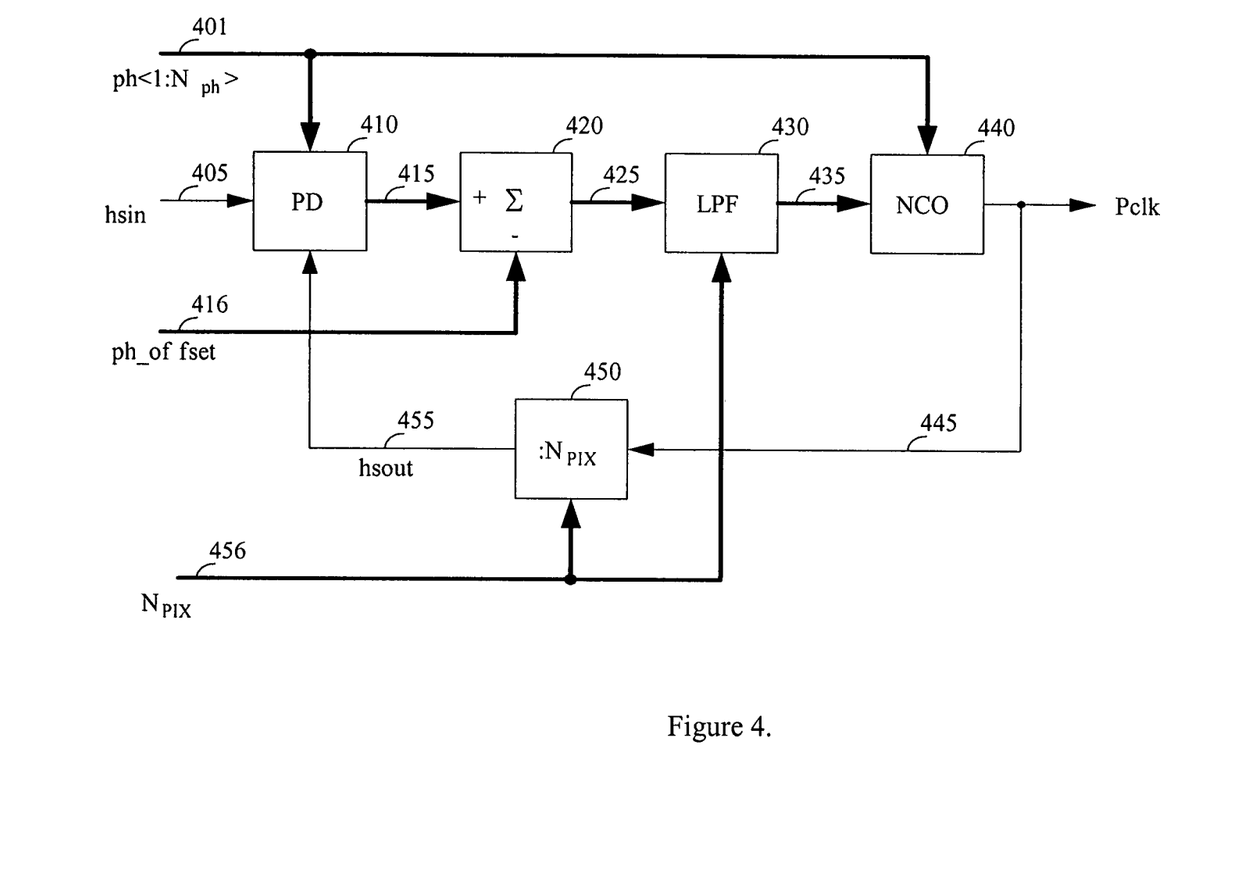
FIG. 4 is a block diagram of a digital PLL using a multi-phase reference clock, according to one embodiment the invention.

A block diagram of a single control loop all digital PLL using multi-phase reference clock is illustrated in FIG. 4. As shown in FIG. 4, in one embodiment, the multi-phase reference clock 401 is used in a phase detector (PD) 410 and a numerically controlled oscillator (NCO) 440. The sync input clock is hsin 405. Each hsin clock cycle, the PD block outputs a phase error value 415 equal to the phase difference between the hsin sync input 405 and the hsout output sync clock 406, measured in units of phase delays in the multi-phase reference clock $T_{ph}$ given by equation (1).

In one embodiment, the phase error 415 can be adjusted by a programmed phase offset input 416 into an arithmetic adder 420. The output of this adder 425 is actually used in the PLL control loop via a low pass filter (LPF) 430. The output 435 of this LPF drives the NCO 440, whose output 445 is the pixel clock Pclk. The pixel clock 445 frequency is divided by a programmable divider 450 to create the feedback output sync signal 455 hsout. The number of pixels per line $N_{PIX}$ is controlled via a dedicated input 456 and this information is also used in the LPF as shown below.

In one embodiment, the widths of the data busses in this design may be computed from design specifications as follows. $N_{pa}$ represents the number of pixels per line, i.e. number of pixel clock periods corresponding to one input sync period. In general, this number is smaller than 3,000, so a 12-bit bus is sufficient for $N_{PIX}$ programmability. The phase error 415 is an integer numerical representation of phase error between hsin and hsout in units of $T_{ph}$. Using a minimum input sync frequency $f_{hsmin}$, in this example 10 KHz, the maximum number needed to be represented on these busses will be $$\text{errmax} = \frac{1}{f_{hsmin} \cdot T_{ph}} \quad (3)$$

or 459,000 in this example, that requires 19 bits for representation.

In one embodiment, the phase offset 416 ph_offset is in general an integer number or the intended phase offset between hsin and hsout signals in units of $T_{ph}$. Assuming a minimum pixel clock frequency $f_{pixmin}$, in this example 10 MHz, the maximum number needed to be represented on these busses will be calculated as follows:

$$\text{offsetmax} = \frac{1}{f_{pixmin} \cdot T_{ph}} \quad (4)$$

or equal to 459 in this example, which requires 9 bits for representation.

However, the PLL control algorithm discussed further can actually process fractional phase errors and fractional phase offsets. In this case, the width of the phase error data buss 425 should be increased from the 415 bus data width by the fractional phase offset representation. For a pure digital implementation of the pixel clock regeneration approach, the fractional phase offset may not be very useful, since the expected pk-pk jitter of the regenerated clock is larger than $T_{ph}$ and up to 2 $T_{ph}$. The digital PLL algorithm will only maintain on average a phase offset between hsin and hsout signals, as programmed by the ph_offset input. Using an analog PLL as a filter for the pixel clock, as described in detail below, the output jitter may be reduced further to a fraction of a $T_{ph}$ interval, in which case a fractional representation of desired phase offset is much more appropriate.

The output 435 of the low pass filter can be interpreted as the Pclk period in units of $T_{ph}$ and is a fractional number. The integer part can be easily determined by the minimum pixel clock frequency required in the design, while the fractional part is a trade-off between the jitter induced by numerical accuracy (truncation) and complexity of the LPF and NCO implementation.

Particular implementations of the frequency divider 450 and the numerical controlled oscillator are well known in the art. The focus of the embodiments described below will remain in the proposed implementation of the PD 410 and the single loop control implemented in the LPF 430.

In one embodiment, for the description of the control algorithm, let's assume that the k-th rising edge time of the input sync hsin signal 405 can be calculated as follows:

$$T_{hsin}(k) = k \cdot T_s + \epsilon(k) \quad (5)$$

wherein $T_s$ is the average period of the input sync signal and $\epsilon(k)$ is the jitter at the k-th hsin pulse.

The number of multi-phase reference clock phase in between the rising edge of the k-th hsout pulse and the previous rising edge hsout pulse can be calculated as follows:

$$N(k) = N_{clk}(k) \cdot N_{PIX} \quad (6)$$

wherein the $N_{clk}(k)$ is the NCO control word 435, representing the Pclk period in units of $T_{ph}$. Thus, the rising edge of the output sync signal hsout 455 is $$T_{hsout}(k) = \sum_{i=1}^{K} N(i) \cdot T_{ph} \quad (7)$$

The phase error output of the PD 410 can be expressed as $$\text{err}(k) = \frac{T_{hsin}(k) - T_{hsout}(k)}{T_{ph}} = \frac{k \cdot T_s + \epsilon(k)}{T_{ph}} - \sum_{i=1}^{K} N(i) \quad (8)$$

Writing the same equation (8) for the k−1 instance, we can infer the following relation:

$$N(k) = \frac{T_s}{T_{ph}} + \text{err}(k) - \text{err}(k-1) + \epsilon(k-1) - \epsilon(k) \quad (9)$$

In one embodiment, for the control loop algorithm, a control equation is needed such that the err(k) converges to zero. Since the $\epsilon(k)$ is the input jitter with a mean zero value, equation (9) implies that if err(k) converges to zero, the frequency of the regenerated Pclk is such that there are exactly $N_{PIX}$ pixel clocks in a $T_s$ period:

$$\lim_{k} N_{clk}(k) \cdot N_{PIX} \cdot T_{ph} = T_s \quad (10)$$

In one embodiment, the control algorithm is based on the following update equation:

$$N(k) = N(k-1) + c_1 \cdot \text{err}(k-2) + c_2 \cdot \text{err}(k-3) + c_3 \cdot \text{err}(k-4) \quad (11)$$

where $c_1$, $c_2$, and $c_3$ are predetermined update coefficients. Other control rules are, of course, possible in alternate embodiments, and it is to be understood that other variations may be contemplated. The embodiment described in detail above represents a good compromise between complexity of implementation (only three delayed phase error values are used) and performance. The new control value N(k) is computed only once per sync signal period. Since only delayed versions of the phase error values are used, the algorithm allows very long time for the actual phase error to be determined in the phase detector and the new NCO control value to be computed.

In an alternate embodiment, equation (11) may also be written in terms of the NCO control value as follows:

$$N_{clk}(k) = \quad (12)$$
$$N_{clk}(k-1) + \frac{c_1}{N_{PIX}} \cdot \text{err}(k-2) + \frac{c_2}{N_{PIX}} \cdot \text{err}(k-3) + \frac{c_3}{N_{PIX}} \cdot \text{err}(k-4)$$

Combining system equation (9) and the control equation (11), the control transfer function from the input jitter $\epsilon(k)$ to the phase error err(k) can be written in the z-domain as follows:

$$H(z^{-1}) = \frac{\text{err}(z^{-1})}{\epsilon(z^{-1})} = \frac{1 - 2 \cdot z^{-1} + z^{-2}}{1 - 2 \cdot z^{-1} + (1 + c_1) \cdot z^{-2} + c_2 \cdot z^{-3} + c_3 \cdot z^{-4}} \quad (13)$$

If the coefficients $c_1$, $c_2$, and $c_3$ are chosen such that the denominator in equation (13) has all the roots inside the unit circle, the transfer function (13) is stable and represents a low pass filter from the input jitter $\epsilon(z^{-1})$ to the phase error err($z^{-1}$). Since the input jitter has zero mean, the control algorithm (11), and equivalent (12), leads to a convergent value for the phase error or zero.

In the above embodiment, the err(k) phase error was the input signal 425 to the LPF 430. However, the phase error err(k) is the true phase error output 415 of the phase detector minus a phase offset ph_offset 416. In this case, the frequency of the regenerated pixel clock 445 still converges to its required value, but the phase of the output sync signal hsout 455 will be shifted from the phase of the input sync signal hsin 405 by the amount programmed in the phase offset value ph_offset 416.

Various numerical values may be considered in alternate embodiments for the update coefficients $c_1$, $c_2$, and $c_3$ as a trade-off between averaging the input sync signal jitter and fast frequency/phase convergence. Particular values proposed are as follows:

$$c_1 = \frac{1}{2^K} \quad (14)$$

$$c_2 = -c_1 \quad (15)$$

$$c_3 = \frac{1}{2^{2 \cdot K + 2}} \quad (16)$$

which are relatively easy to implement, and for K positive and larger than 1, guarantee asymptotic stability of the control loop. Update coefficients corresponding to K=1 value achieve a very fast frequency/phase convergence in about 10 sync pulses, reducing the need for additional algorithm modifications or adds-on such as pixel clock rate estimation and initialization of the output sync divider for faster initial acquisition, while increasing K gives a progressively lower corner frequency of the input jitter integration. The value of K and corresponding update coefficients according to equations (14)-(16) can be made externally programmable and/or adaptive depending on the application and input signal characteristics.

Other modifications of the control loop algorithm are possible and may be desirable for certain applications. In alternate embodiments, for video applications compatible with TV signal, the input sync signal may not be available during the vertical blanking period. In this case, a "coast" signal may be generated either externally or internally to instruct the pixel clock reconstruction PLL to maintain the previous pixel clock frequency. In the digital PLL implementation, this would be achieved very easily by freezing the NCO control word and not resume the updates until several sync clocks after the "coast" condition clears.

The ability of the phase detector PD to accurately measure the phase error between the hsin and hsout signals is very important for the PLL control algorithm. The resolution of the PD should be on, given by $T_{ph}$, and that resolution should be maintained for arbitrarily large phase differences between hsin and hsout, up to a full period of a sync signal.

In general, the input sync signal hsin is not synchronous with the reference clock and can exhibit quite a large jitter. The output sync signal hsout can have a large delay from the reference clock edges that generate this clock, so it can also be considered as asynchronous from the PD perspective. It is very important for the PD to recover from metastability and to limit the errors actually introduced in the phase error output by metastable states.

Figure 5:
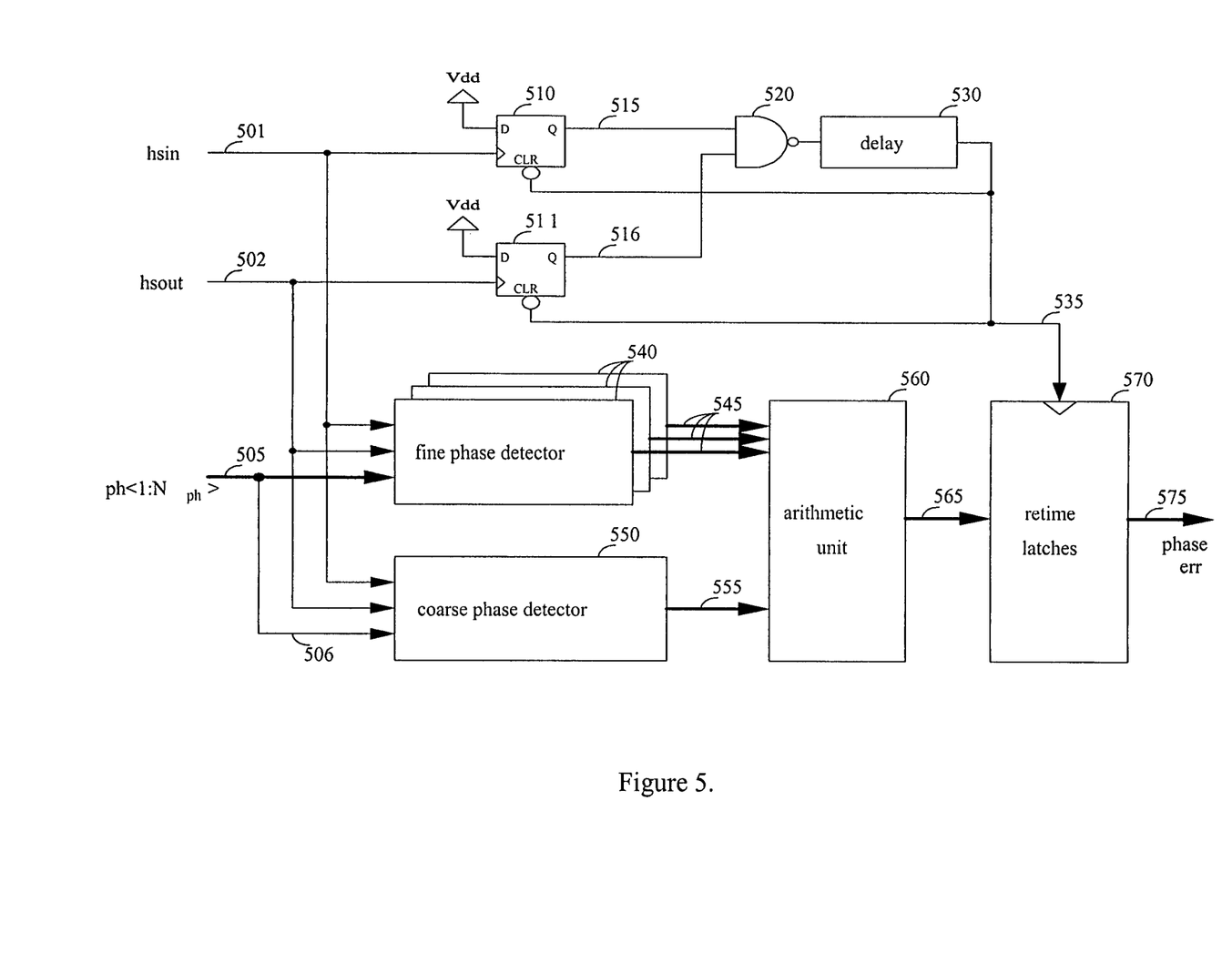
FIG. 5 is a block diagram of a phase/frequency detector using a multi-phase reference clock, according to one embodiment of the invention.

FIG. 5 is a block diagram of a phase/frequency detector using a multi-phase reference clock. As shown in FIG. 5, in one embodiment, a configuration of a phase/frequency detector comprising two resetable flip-flops 510 and 511, a NAND gate 520 and a delay element 530 is used to generate a delayed strobe signal 535, which is delayed from the slower of the inputs 501 hsin and 502 hsout.

In one embodiment, a coarse phase detector 550 uses only one phase of the reference clock 506 and provides an phase error output with an uncertainty of up to one reference clock period, or $N_{ph}*T_{ph}$. This uncertainty is refined by multiple fine phase detectors 540, one for each phase of the multi-phase reference clock 505. Each of the phase detector works at the reference clock rate as opposed to higher rates corresponding to the phase resolution $1/T_{ph}$. The output 555 of the coarse phase detector 550 is combined with the outputs 545 of the fine phase detectors 540, in an arithmetic unit 560, whose output 565 is latched in the retime latches 570 by the strobe signal 535.

Figure 6:
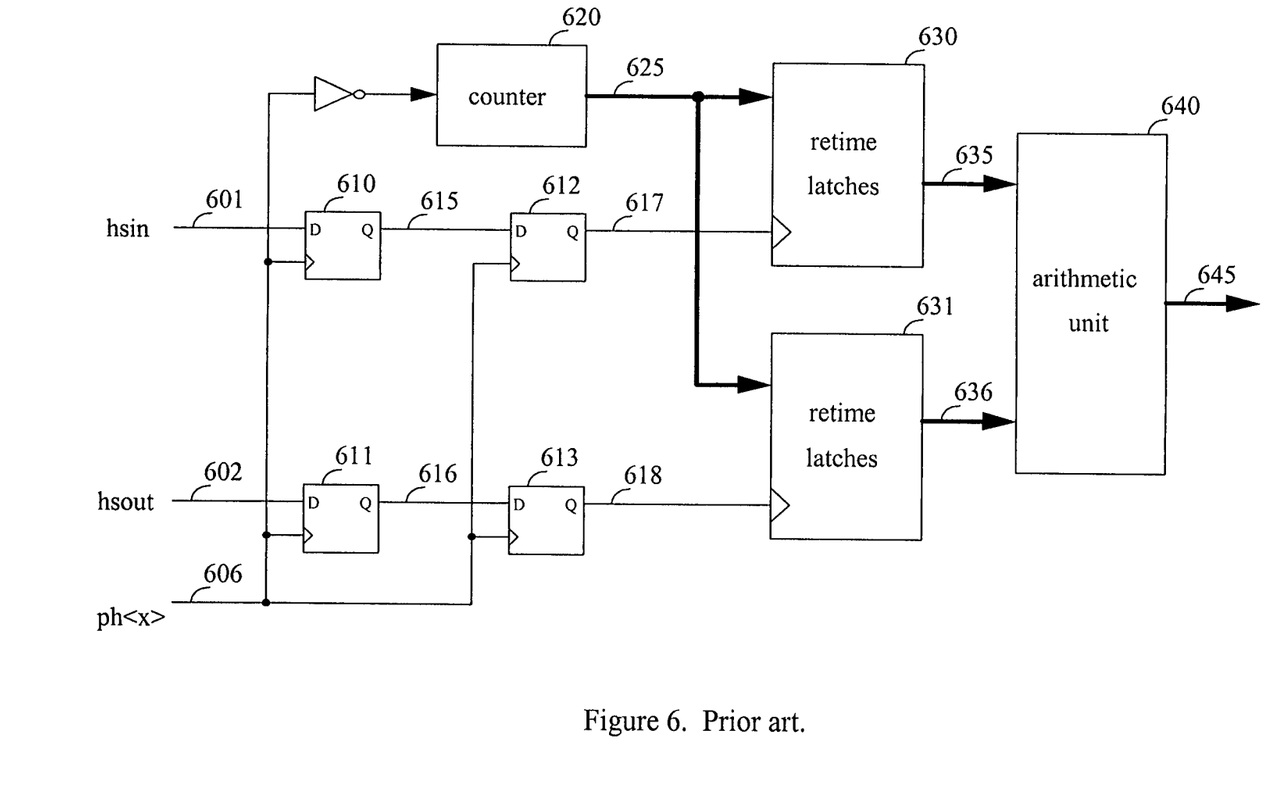
FIG. 6 is a block diagram of a conventional coarse phase detector.

Many approaches for the coarse detector are possible, such as, for example, using the output of the coarse phase/frequency detector, by counting the width of the outputs 515 and 516 of the flip-flops 510 and 511 in FIG. 5. Another possible known implementation for the coarse phase detector is shown in FIG. 6. In one embodiment, a counter 620 is used to increment its output 625 at the reference clock 606 rate. The two input sync signals 601 hsin and 602 hsout are retimed with the reference clock, preferably twice, with the flip-flops 610, 611, 612, and 613 as to minimize any metastable states probability and the rising edges of the latched signals 617 and 618 are used to trigger latches 630 and 631. These latches will store the counter value at the moment of the rising edges of the (retimed) inputs hsin and hsout. Therefore, the difference of the two latches output values 635 and 636 computed by the arithmetic unit 640 represents the phase difference between the hsin and hsout rising edges quantized to the reference clock period. In one embodiment, for unambiguous phase errors, the counter 620 has a total number of states larger than the period of the sync signal.

Figure 7:
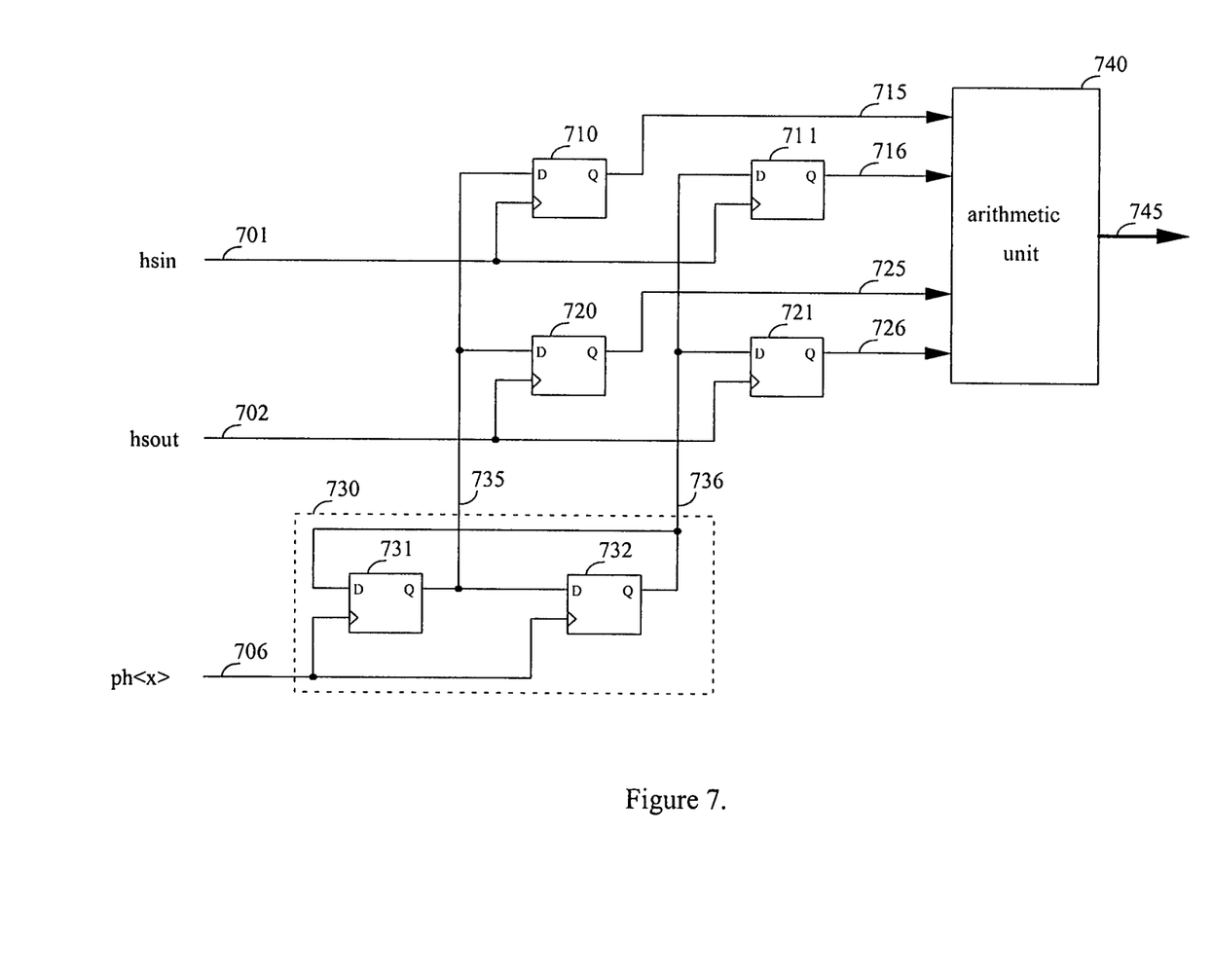
FIG. 7 is a block diagram of a fine phase detector, according to one embodiment of the invention.

One embodiment of a fine phase detector is shown in FIG. 7 and is described in detail below. In one embodiment, a Gray code counter 730 uses two flip-flops 731 and 732 and has 2 binary outputs 735 and 736 encoding a total of 4 binary states. On each rising edge of the reference clock 706, only one of the outputs 735 and 736 changes states. This feature of the Gray code counter is important to minimize errors due to metastable states. The state of the counter, represented by these two outputs 735 and 736, is latched at the rising edge of the input sync signal 701 hsin rising edge in the latches 710 and 711, and at the rising edge of the input sync signal 702 hsout rising edge in the latches 720 and 721. Since the state of the counter repeats every four input clock cycles, the phase difference 745 between the rising edges of 701 hsin and 702 hsout input signals can be computed by the arithmetic unit 740 from the difference in the counter state at the rising edge of hsin and the rising edge of hsout using modulo 4 arithmetic. Hence, the proposed fine phase detector works for arbitrarily large phase differences of the input signals.

Referring back to FIG. 5, in one embodiment, all the phase difference outputs 545 from the fine phase detectors 540 are summed up together with the coarse phase detector output 555. In each of the fine phase detectors 540, implemented as suggested in FIG. 7, there is only one state transition for each multi-phase clock phase change. If metastable states occur due to timing violation between the sync signals and reference clock edges, these states occur in only one of the fine phase detectors, and at most they determine an error of one count in that fine phase detector. Therefore, in one embodiment, the overall error due to metastable states is at most one $T_{ph}$ count.

In another aspect of the arrangement of the coarse/fine phase detector in FIG. 5, the fact that the fine phase detectors work in modulo 4 arithmetic means that their output can correct an error up to one count in the coarse phase detector.

Other configurations are possible and sometimes required for high speed clock applications. For example, the fine phase detectors can have a wider window by using a 3-bit Gray counter rather than a 2-bit counter as was discussed above. The 3-bit configuration will work with a modulo 8 arithmetic and the fine phase detectors can correct errors up to 3 counts in the coarse phase detector.

In yet another aspect of the arrangement of the coarse/fine phase detector, in FIG. 5, the arithmetic unit 560 can check that all the fine phase detector outputs 545 are within +/−1 count of each other and reject/correct the fine phase detector that is not within +/−1 of the average. This can be done because the inherent redundancy in the multiple phase detector ensemble. In the absence of any errors, it is expected that a number P of the $N_{ph}$ fine phase detectors will have on output value, let's call that $FD_1$ while the other $N_{ph}-P$ of fine phase detectors will have an output value $FD_2=FD_1+1$. The arithmetic unit 560 can check for this condition. In case this condition is not met, an error in the phase detector is detected. Depending of the error, the error can be corrected within the arithmetic unit or reported further. For example, if P>1 outputs have a certain value $FD_1$, other $N_{ph}-P-1$ outputs have an output value $FD_2=FD_1+1$, and one output has a value $FD_3 < FD_1$ the arithmetic unit can correct this $FD_3$ value by replacing it with $FD_1$, while if $FD_3 > FD_2$ the arithmetic unit can correct this $FD_3$ value by replacing it with $FD_2$. Obviously, in order to make this determination the number of different output states has to be larger than 4, so a modulo 8 arithmetic and a 3-bit implementation of the fine phase detectors need to be used. If more than one fine detectors outputs is outside the +/−1 count window of the mean, than the arithmetic unit may issue an gross phase error detection and put the digital PLL on "coast".

Figure 8:
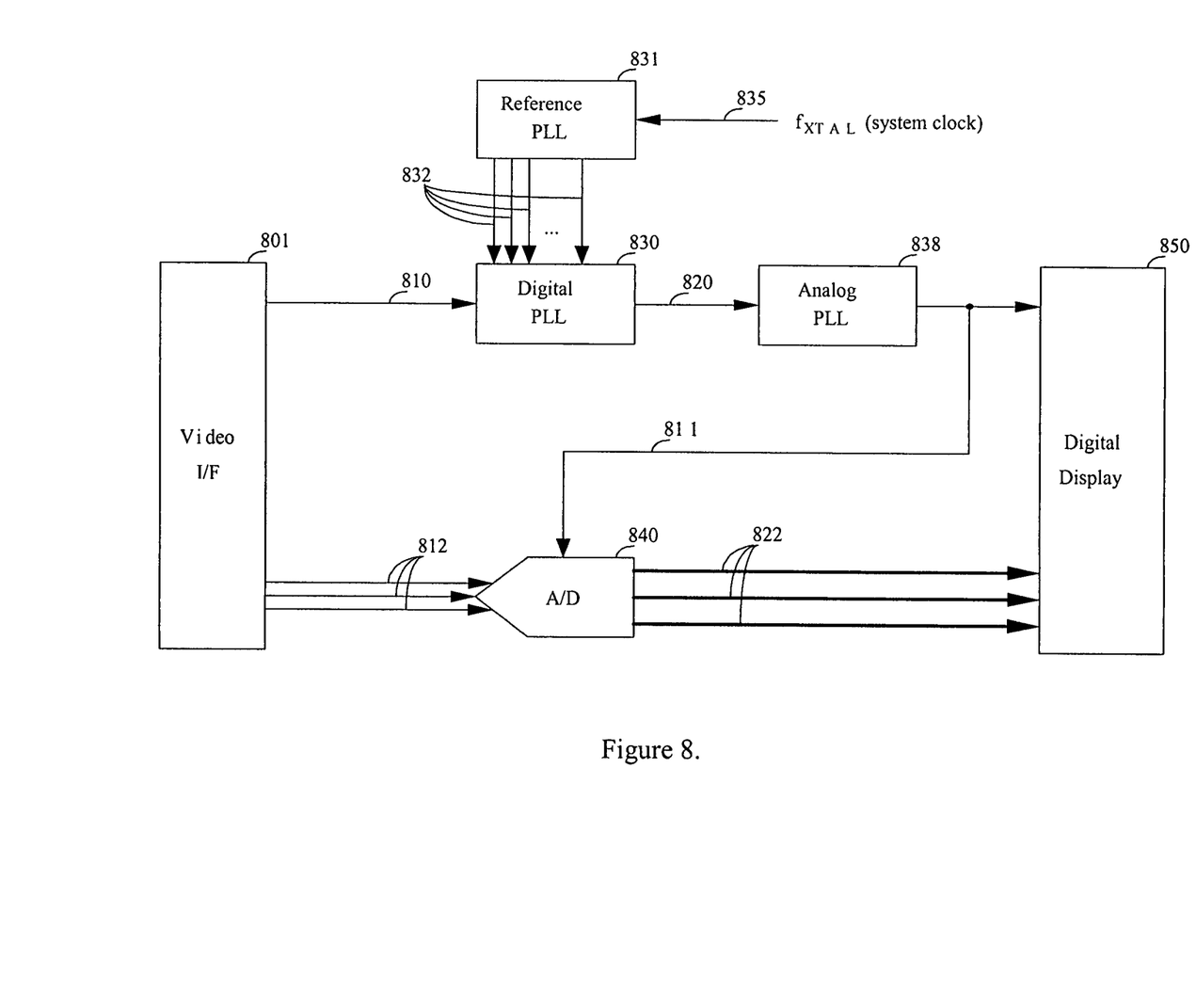
FIG. 8 is a block diagram of a digital display interface, according to an alternate embodiment of the invention.

The all digital PLL with the control algorithm as described above can achieve output clock jitter commensurate with 2 times $T_{ph}$. For special high speed applications, the output clock jitter can be reduced further with an analog PLL 838 as shown in FIG. 8. The analog PLL can also be used to increase the frequency of the output pixel clock.

Figure 9:
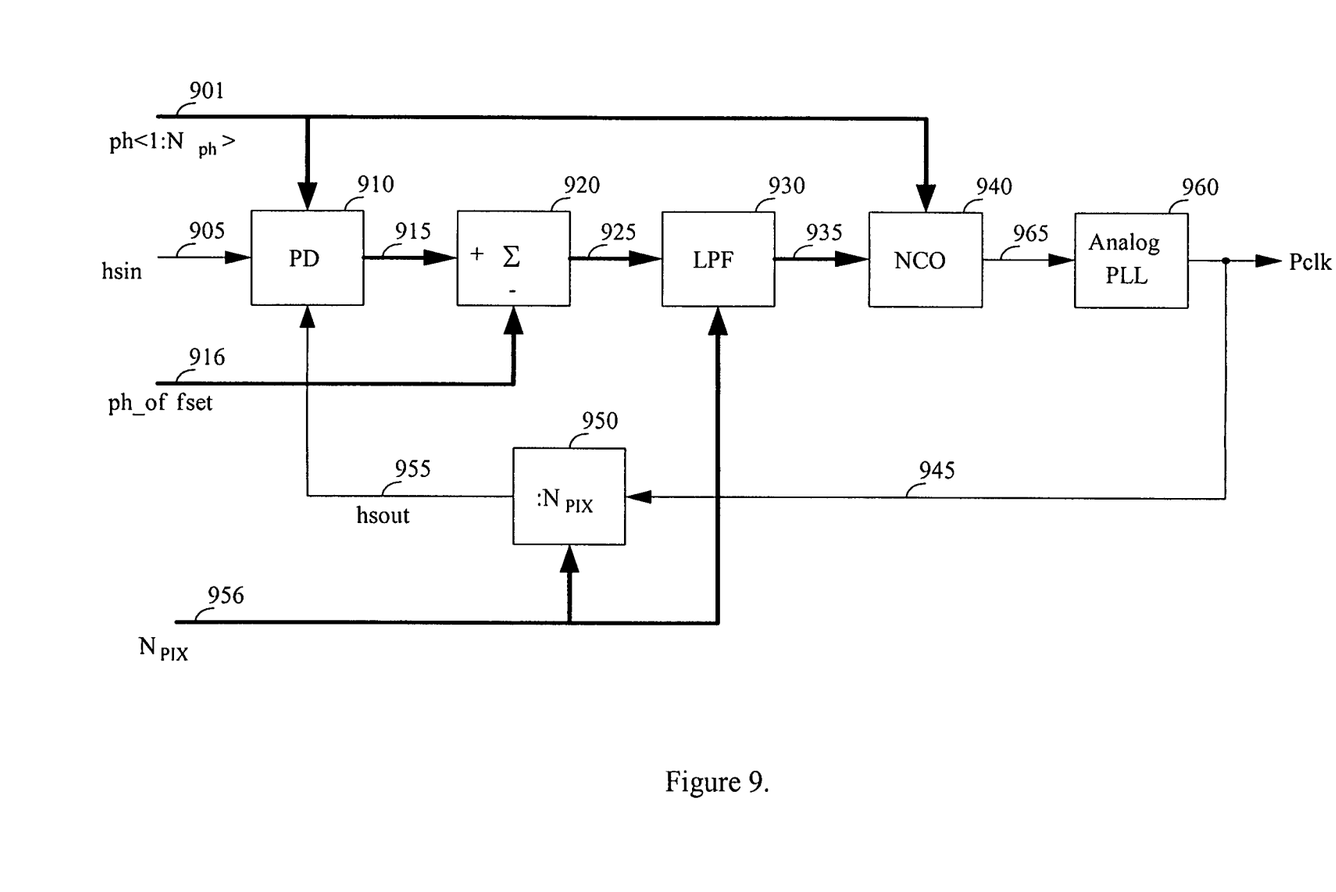
FIG. 9 is a block diagram of a digital PLL using multi-phase reference clock and analog PLL filter, according to another embodiment the invention.

It is actually beneficial in such applications to have the analog PLL inside the digital PLL control loop, as in FIG. 9. In this arrangement, the phase shift in the analog PLL due to environmental changes are cancelled by the digital PLL control loop.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two.

A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In the foregoing description, the invention has been described with reference to specific exemplary embodiments thereof. It will, however, be evident that various modifications and changes be made thereto without departing from the broader spirit and scope of the invention as set forth in the appended claims. The specification and drawings are, accordingly, to be regarded in an illustrative sense rather than a restrictive sense.

The invention claimed is:

1. A digital phase-locked loop (PLL) device comprising:
a phase detector based on a multi-phase reference clock, wherein said phase detector further comprises a coarse phase detector and at least one fine phase detector, such that a predetermined phase difference is quantized with a resolution determined by a phase difference value between multiple phases of said multi-phase reference clock reference;
a digital low pass filter coupled to said phase detector;
a numeric controlled oscillator coupled to said digital low pass filter;
a programmable frequency divider coupled to said phase detector and said numeric controlled oscillator;
wherein a single control loop is configured such that a regenerated output clock (pclk) at an output of said numeric controlled oscillator is in sync with an input sync signal (hsin) at an input of said phase detector.

2. The PLL device according to claim 1, wherein a phase difference between a regenerated sync signal (hsout) at an output of said frequency divider and said input sync signal (hsin) converges to a predetermined programmed value.

3. The PLL device according to claim 1, wherein said coarse phase detector uses a single phase of said reference clock and provides a phase error output having an uncertainty value of up to a reference clock period.

4. The PLL device according to claim 1, wherein said at least one fine phase detector further comprises multiple fine phase detectors assigned to each phase of said multi-phase reference clock.

5. The PLL device according to claim 4, wherein each of said fine phase detectors uses a clocking scheme such that one single digital bit changes its state every reference clock cycle.

6. A digital display interface configured to receive analog display data from a digital phase-locked loop (PLL) device for pixel clock recovery, the PLL device comprising:
a phase detector based on a multi-phase reference clock, wherein said phase detector further comprises a coarse phase detector and at least one fine phase detector, such that a predetermined phase difference is quantized with a resolution determined by a phase difference value between multiple phases of said multi-phase reference clock reference;

a digital low pass filter coupled to said phase detector;

a numeric controlled oscillator coupled to said digital low pass filter; and a programmable frequency divider coupled to said phase detector and said numeric controlled oscillator;

wherein a single control loop is configured such that a regenerated output clock (pclk) at an output of said numeric controlled oscillator is in sync with an input sync signal (hsin) at an input of said phase detector.

7. The digital display interface according to claim 6, further comprising an analog PLL for pixel clock filtering.

8. A phase-locked loop (PLL) device comprising:

a digital phase detector based on a multi-phase input clock, wherein said phase detector further comprises a coarse phase detector and at least one fine phase detector, such that a predetermined phase difference is quantized with a resolution determined by a phase difference value between multiple phases of said multi-phase reference clock reference;

a digital low pass filter;

a numeric controlled oscillator;

a programmable frequency divider;

an analog PLL for output clock filtering and/or frequency multiplication;

a single control loop such that the regenerated output clock [pclk] is in sync with a sync input signal [hsin] and the phase difference between a regenerated sync signal [hsout] and the sync input signal [hsin] converges to a programmed value.

9. The PLL device according to claim 8, wherein the digital phase detector includes a digital coarse phase detector and a digital fine phase detector, such that a large phase difference is quantized with a resolution determined by a phase difference between multiple phases of the multi-phase clock reference.

10. The PLL device according to claim 9, wherein said digital fine phase detector further comprises multiple phase detectors working on each phase of said multi-phase clock reference.

11. The PLL device according to claim 10, wherein each of said phase detectors uses a clocking scheme such that one single digital bit changes state every reference clock cycle in order to minimize metastable state errors.

* * * * *